(12) United States Patent
Colclaser et al.

(10) Patent No.: US 6,501,630 B1
(45) Date of Patent: Dec. 31, 2002

(54) BI-DIRECTIONAL ESD DIODE STRUCTURE

(75) Inventors: Roy A. Colclaser, Albuquerque, NM (US); David M. Szmyd, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/466,401

(22) Filed: Dec. 17, 1999

(51) Int. Cl.⁷ .................................................. H02H 9/00
(52) U.S. Cl. ........................................ 361/56; 361/91.1
(58) Field of Search ......................... 361/56, 91.1, 100; 257/360

(56) References Cited

U.S. PATENT DOCUMENTS

| | | | | |
|---|---|---|---|---|
| 4,484,244 A | * | 11/1984 | Avery ........................... | 361/56 |
| 4,567,500 A | | 1/1986 | Avery ........................... | 357/38 |
| 4,595,941 A | | 6/1986 | Avery ........................... | 357/43 |
| 5,012,317 A | * | 4/1991 | Rountre ........................ | 357/38 |
| 5,182,220 A | * | 1/1993 | Ker et al. ..................... | 437/34 |
| 5,440,151 A | | 8/1995 | Crevel et al. ................ | 257/173 |
| 5,446,295 A | | 8/1995 | Whitney ...................... | 257/113 |
| 5,455,436 A | | 10/1995 | Cheng ......................... | 257/356 |
| 5,516,705 A | * | 5/1996 | Webb et al. .................... | 437/6 |
| 5,581,104 A | | 12/1996 | Lowrey et al. .............. | 257/355 |
| 5,600,525 A | * | 2/1997 | Avery ........................... | 361/56 |
| 5,696,390 A | | 12/1997 | Godignon et al. .......... | 257/109 |
| 5,717,559 A | | 2/1998 | Narita .......................... | 361/56 |
| 5,808,342 A | | 9/1998 | Chen et al. .................. | 257/357 |
| 5,994,760 A | | 11/1999 | Duclos ........................ | 257/546 |
| 6,016,002 A | | 1/2000 | Chen et al. .................. | 257/546 |
| 6,144,542 A | | 11/2000 | Ker et al. .................... | 361/111 |
| 6,194,764 B1 | | 2/2001 | Gossner et al. ............. | 257/355 |

FOREIGN PATENT DOCUMENTS

| | | | |
|---|---|---|---|
| DE | 4229307 A1 | 3/1994 | ......... H01L/29/747 |
| EP | 0388022 A2 | 9/1990 | ............ H04M/3/18 |
| EP | 0477393 A1 | 4/1992 | ............ H01L/27/02 |
| EP | 2719721 | 11/1995 | ............ H02H/9/04 |
| FR | 2566582 | 12/1985 | ........... H01L/27/08 |
| FR | 2773265 | 7/1999 | ........... H01L/26/62 |
| GB | 2293484 A | 3/1996 | ......... H01L/29/747 |
| WO | WO8706768 | 11/1987 | ......... H01L/29/743 |

OTHER PUBLICATIONS

General Electric Co., 1961, Silicon Controlled Rectifier, Manual; GE, pp. 4, 5, 39.*

* cited by examiner

Primary Examiner—Stephen W. Jackson
Assistant Examiner—Z Kitov
(74) Attorney, Agent, or Firm—Dicran Halajian

(57) ABSTRACT

A bi-directional ESD diode protects a circuit against electrostatic discharge (ESD). The bi-directional diode has a first device and a second device, each including a first region and a third region formed by doping a semiconductor substrate so that it has a P-type conductivity; and a second region and a fourth region formed by doping the semiconductor substrate so that it has an N-type conductivity. The first region of the first device and the fourth region of the second device are for connection to an anode terminal of the bi-directional diode. The fourth region of the first device and the first region of the second device are for connection a cathode terminal of the bi-directional diode. The anode terminal is for connection to a signal terminal of the circuit when the cathode terminal is connected to a positive power line of the circuit, and the cathode terminal is for connection to the signal terminal when the anode terminal is connected to a ground line or a negative power line of the circuit.

9 Claims, 4 Drawing Sheets

BI-DIRECTIONAL ESD DIODE STRUCTURE

CROSS-REFERENCE TO RELATED APPLICATIONS

U.S. patent application Ser. No. 09/466,411, entitled "Improved ESD Diode" filed concurrently herewith for Roy A. Colclaser and David M. Szmyd, and assigned to the assignee hereof, contains subject matter related to the subject matter of the present patent application.

BACKGROUND OF THE INVENTION

1. Field of the Invention

The present invention is directed to a device used for protecting circuits against electrostatic discharge (ESD), and more particularly, to an ESD diode having a reduced capacitance.

2. Discussion of the Prior Art

FIG. 1 shows conventional-circuit arrangement 100 which is protected against electrostatic discharge (ESD). The device being protected is a circuit 110, which may be formed on a semiconductor substrate of an integrated circuit or chip. The input 115 and output 120 of the circuit 110 are connected to input and output pads 125, 130, respectively, which in turn are connected to pins of the integrated circuit or chip.

Typically, the input 115 and output 120 of the circuit 110, are protected against an electrostatic discharge (ESD) using diodes D1, D2, D3 and D4 connected between the input/output pads 125, 130 and power lines. The power lines include a ground bus 135 and a power supply bus 140, which is connected to a voltage source for providing a positive voltage, referred to as Vcc.

As is well known in the art, each of the diodes D1, D2, D3 and D4 is formed by a P-N-junction, and may be integrated on the same chip or integrated circuit that includes the circuit 100 to be protected. For protection against positive ESD, the diodes D1, D2 have their anodes (P-side) connected to the input 115 and output 120 of the circuit 110. The cathodes (N-side) of the diodes D1, D2 are connected to the power supply bus 140 having the positive voltage Vcc. For protection against negative ESD, the diodes D3, D4 have their cathodes (N-side) connected to the input 115 and output 120 of the circuit 110. The anodes (P-side) of the diodes D3, D4 are connected to the ground bus 135. FIG. 1 shows the anode (P-side) of the diode D1 as numeral 145 and the cathode (N-side) as numeral 150. It is understood by those skilled in the art that the discussion of the diode D1 is for illustration purposes, and is equally applicable to all the diodes D1–D4.

As is well known in the art, each diode (e.g., diode D1) blocks current when reverse biased, which is when the cathode (N-side) 150 is made positive with respect to the anode (P-side) 145 until the cathode voltage is high enough to cause breakdown. In the reverse bias mode of operation, the current from the cathode 150 to the anode 145 is very low and is called leakage current.

When the anode 145 or P-side is made positive with respect to the cathode 150 or N-side, the mode of operation is referred to as forward bias. Further, the voltage across the diode D1 is referred to as the forward bias voltage, which is the voltage from the anode 145 to the cathode 150. If the forward bias voltage is increased across the diode D1, the current from the anode 145 to the cathode 150, referred to as the anode current, increases exponentially with the voltage as shown by the plot 410 shown in FIG. 4. For a typical silicon diode, the effect of this rise in current switches the diode D1 into an ON state at a threshold or TURN-ON voltage $V_T$ of approximately 0.7 volts. Above this TURN-ON voltage $V_T$, i.e., in the ON state, the voltage increases gradually while the current increases significantly. Note that under high current conditions, e.g. during an ESD event, the voltage across the diode can rise to several volts, due to the internal resistance of the diode.

As shown in the plot 410 of FIG. 4, the diodes D1–D4 provide an open circuit in the reverse direction or block current flow from the cathode 150 to the anode 145. When the voltage on anode 145 is greater than the voltage on the cathode 150 by the TURN-ON voltage $V_T$, the diode D1 turns on in the forward direction, and provides a relatively low resistance path for current flow from the anode 145 or P-side to the cathode 150 or N-side.

ESD events can occur with either polarity between any pair of pins on an integrated circuit. ESD protection must therefore be provided from each input/output pin to both the power supply bus 140 and the ground bus 135 and to all other input/output pins. In addition, ESD protection is required for both positive and negative polarities between the power supply bus 140 and the ground bus 135. For a positive ESD to the input/output pads, e.g., the input pad 125, with respect to the ground bus 135, the ESD current passes through diode D1 to the power supply bus 140. Next, this ESD current passes to the ground bus 135 though a clamp structure 155 which is located between the power supply bus 140 and the ground bus 135. For a negative ESD to the input pad 125 with respect to the ground bus, the ESD current passes through diode D3 to the ground bus 135.

For positive ESD to the input/output pads 125, 130 with respect to the power supply bus 140, the ESD current passes through diodes D1, D2 to the power supply bus 140. For a negative ESD to the input/output pads 125, 130 with respect to the power supply bus 140, which is the same as a positive ESD from the power supply bus 140 with respect to the input/output pads 125, 130, the ESD current passes through the clamp structure 155 and through the diodes D3, D4 to the pad.

For a positive ESD between input/output pads 125 and 130, the ESD current passes through diode D1 to the power supply bus 140, through the power supply clamp 155 to the ground bus 135 and through the diode D4. For a negative ESD between input/output pads 125 and 130, the ESD current passes through diode D2 to the power supply bus 140, through the power supply clamp 155 to the ground bus 135 and through the diode D3.

For positive ESD between the power supply bus 140 and the ground bus 135, the ESD current passes through the power supply clamp 155. For negative ESD between the power supply bus 140 and the ground bus 135, the ESD current passes through one or more of the series diode strings D1 and D3 or D2 and D4.

The conventional ESD protected circuit arrangement 100 provides an effective protection scheme for many situations. However, when reverse biased, each diode D1, D2, D3 and D4 provides a capacitive load on input/output signals which can significantly degrade the input and output signals and performance of the circuit 110, particularly at high frequencies. Thus, the major disadvantage of the conventional diode D1 occurs during normal (non-ESD) operation. In this case, the diodes D1, D2 connected between the input or output pins or pads 125, 135 and the power supply line 140, as well as the diodes D3, D4 connected between ground 135 and the pads 125, 135, are reverse biased where an analogue input signal is biased between the power supply and ground.

Each of the diodes D1–D4 has a capacitance that is associated with the diode P-N junction where the capacitance depends on the area and the doping configuration. Part of the high frequency input signal is diverted through the diodes to circuitry other than the intended path. Reducing the size or area of the diodes reduces the capacitance, but it also reduces the level of ESD protection, since the level of ESD protection depends on the current density in the diode.

Accordingly, there is a need to reduce capacitive loads connected to input/output lines while maintaining a desired level of ESD protection.

SUMMARY OF THE INVENTION

The object of the present invention is to provide an electrostatic discharge (ESD) protection device that significantly reduces the problems of conventional ESD protection devices.

The present invention accomplishes the above and other objects by providing an ESD protection device, referred to as a bi-directional ESD diode for example, which protects a circuit against electrostatic discharge and allows proper operation, particularly at high frequencies. The bi-directional ESD diode has first and second devices, referred to as ESD diodes, which are connected in an anti-parallel configuration. Each ESD diodes includes a first region and a third region formed from a semiconductor substrate having a p-type conductivity; and a second region and a fourth region formed from the semiconductor substrate having an N-type conductivity.

The first region of the first ESD diode and the fourth region of the second ESD diode are for connection to an anode terminal of the bi-directional diode. The fourth region of the first ESD diode and the first region of the second ESD diode are for connection a cathode terminal of the bi-directional diode. The anode terminal is for connection to a signal terminal of the circuit when the cathode terminal is connected to a positive power line of circuit, and the cathode terminal is for connection to the signal terminal when the anode terminal is connected to a ground line or a negative power line of the circuit.

In another embodiment, the two ESD diodes are merged to form the bi-directional ESD diode. The merged bi-directional ESD diode has four adjacent regions, where the first and third regions are P-type; and the second and fourth regions are N-type.

The first region includes a first portion having an N-type conductivity for connection to the anode, and the fourth region includes a second portion having a P-type conductivity for connection to the cathode. The second portion is formed from an extension of the third region toward the cathode terminal.

A first conductive layer is formed over the first region and the first portion, and a second conductive layer formed over the fourth region and the second portion. The first conductive layer is connected to the anode terminal and the second conductive layer is connected to the cathode terminal.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 1:
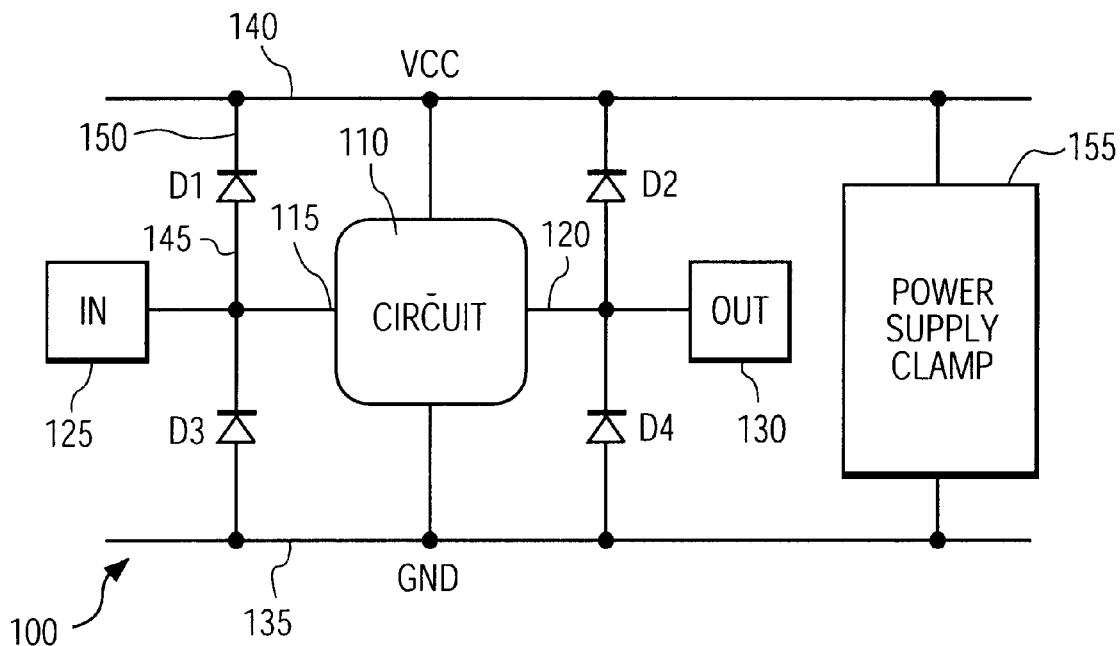
FIG. 1 shows a conventional circuit arrangement which is protected against electrostatic discharge (ESD)
Figure 2:
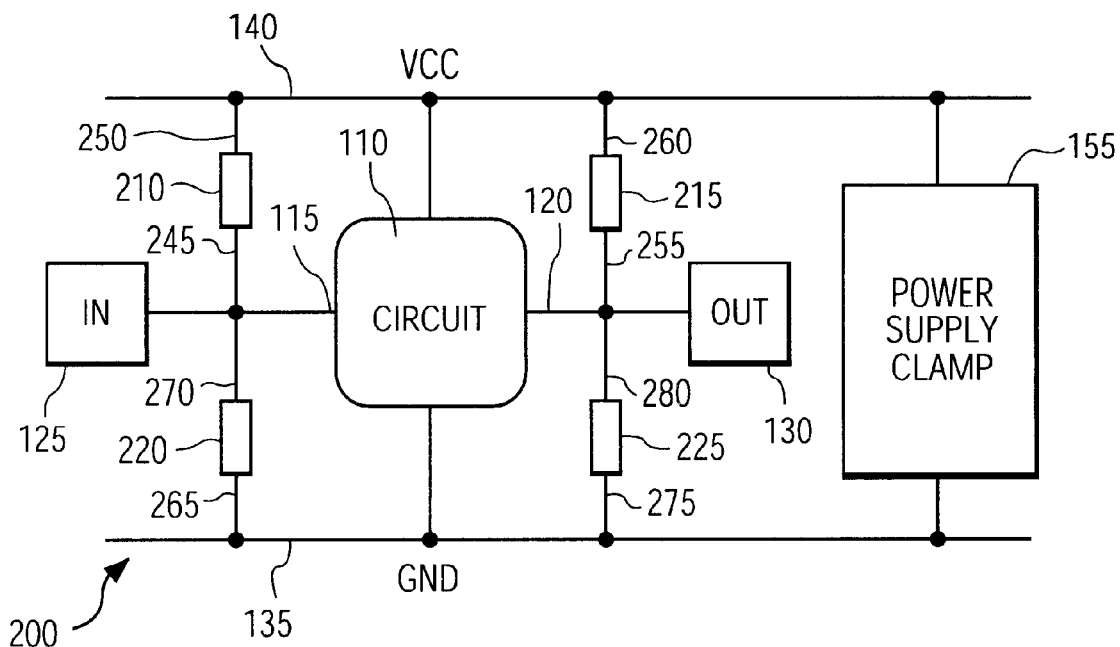
FIG. 2 shows a circuit arrangement which is protected against ESD using ESD diodes according to present invention.

FIG. 2 shows a circuit arrangement 200 where the diodes D1–D4 shown in FIG. 1 are replaced with devices that provide improved electrostatic discharge (ESD) protection. In particular, diodes D1, D2, D3, D4 are replaced with two terminal integrated structures referred to as ESD diodes 210, 215, 220, 225, respectively.

The anode 245 of the ESD diode 210 and the anode 255 of the ESD diode 210 are connected to the input 115 and output 120 of the circuit 110, respectively. The cathodes 250, 260 of the ESD diodes 210, 215 are connected to the power supply bus 140. Further, the cathode 270 of the ESD diode 220 and the cathode 280 of the ESD diode 225 are connected to the input 115 and output 120 of the circuit 110, respectively. The anodes 265, 275 of the ESD diodes 220, 225 are connected to the ground bus 135, which may be replaced with a bus that provides a voltage lower than the voltage of the power supply bus 140. Illustratively, the voltage of the power supply bus 140 is a positive voltage Vcc and the bus 135 is either a ground bus or provides a negative voltage, for example.

ESD protection is provided in a fashion similar to the conventional circuit arrangement 100 shown in FIG. 1. For example, the ESD devices 210, 215 protect the input 115 and output 120 of the circuit 119, respectively, against positive ESD with respect to the ground bus 135. In particular, current from a positive ESD on the input 115 with respect to the ground bus 135 passes through the ESD diode 210 to the power supply bus 140. Similarly, current from a positive ESD on the output 120 with respect to the ground bus 135 passes through the ESD device 215 to the power supply bus 140. Next, these ESD currents pass to the ground bus 135 though the clamp structure 155. The clamp 155 is designed to absorb the ESD event without being destroyed or without allowing the voltage across it to increase to the point where other devices in the internal circuit 110 would be destroyed. For a negative ESD on the input 115 with respect to the ground bus 135, the ESD current passes through the ESD diode 220 to the ground or negative voltage bus 135. Similarly, for a negative ESD on the output 120 with respect to the ground bus 135, the ESD current passes through the ESD diode 225 to the ground or negative voltage bus 135.

Figure 3:
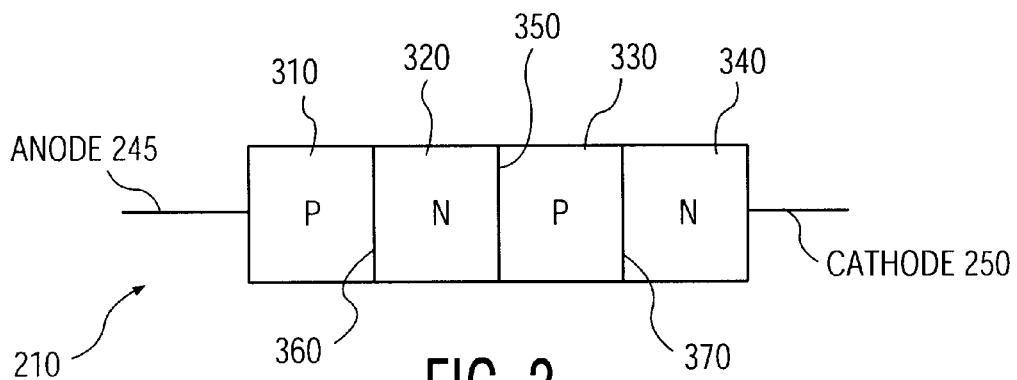
FIG. 3 shows one of the ESD diodes shown in FIG. 2 in greater detail according to present invention.

FIG. 3 shows one of the ESD diodes 210, 215, 220, 225 shown in FIG. 2 in greater detail, such as the ESD diode 210 for example. It is understood by those skilled in the art that the discussion of the ESD diode 210 shown in FIG. 3 is for illustration purposes, and is equally applicable to all the ESD diodes 210, 215, 220, 225 shown in FIG. 2.

As shown in FIG. 3, the ESD diode 210 is a two terminal PNPN device which has four regions 310, 320, 330, 340. The first and third regions 310, 330 are formed by doping a semiconductor substrate, such as silicon, so that it has a P-type conductivity. As is well know in the art, the silicon substrate may be doped with boron to achieve the P-type conductivity. The second and fourth regions 320, 340 are formed by doping the semiconductor substrate so that it has an N-type conductivity, where the silicon is doped with arsenic or phosphorus for example. The first and fourth regions 310, 340 are connected to the ESD diode terminals, where the first region 310 is connected to the anode terminal 245 and the fourth region 340 is the cathode terminal 250.

With respect to the ESD diodes 210, 215 shown in FIGS. 2–3, the first region 310 or anode 245, 255 is for connection to a signal terminal, e.g., input or output terminal 115, 120 of the circuit 110 when the fourth region 340 or cathode 250, 260 is connected to the positive power line 140. With respect to the ESD diodes 220, 225, the fourth region 340 or cathode 270, 280 is for connection to the signal terminal when the first region 310 or anode 265, 275 is connected to the ground line 135 which, instead of ground, may provide a lower voltage level than Vcc, such as a negative voltage.

The ESD diode 210 operates as follows. In the reverse bias mode, where the cathode 250 or fourth region 340 is made positive with respect to the anode 245 or first region 310, the ESD diode 210 blocks current similar to a conventional diode D1 (FIG. 1). In the forward bias mode, the anode 245 is made positive with respect to the cathode 250, the ESD diode 210 also blocks current, until the avalanche voltage $V_A$ of the center junction 350 is reached, where the center junction 350 is the P-N junction between the third and second regions 330, 320. Since the center junction can be represented as a capacitance, it is also possible to trigger the device into the high current and low voltage ON state by a rapid change in the voltage between the anode and cathode.

Figure 4:
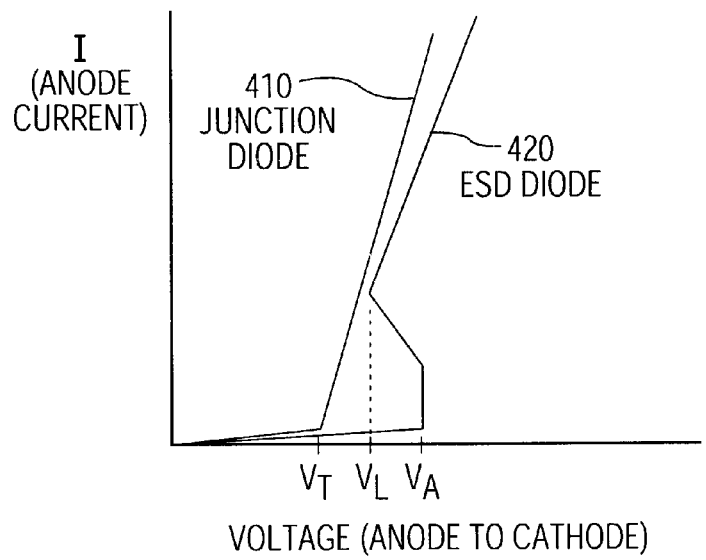
FIG. 4 shows plots of the forward biased current-voltage characteristics of a conventional diode and the ESD diode according to present invention.

FIG. 4 shows plots of the forward biased current-voltage characteristics of a conventional diode D1 (FIG. 1) and the ESD diode 210 (FIGS. 2–3), where the conventional diode plot is referenced by numeral 410, and the ESD diode plot is referenced by numeral 420. At the avalanche voltage $V_A$, if the doping concentrations and the geometries of the four regions 310, 320, 330, 340 shown in FIG. 3 are properly designed, then the ESD device 210 snaps to a low voltage state $V_L$ and turns ON thus allowing a large current to flow. The low voltage level $V_L$ is the voltage drop across the ESD diode 210 in the ON state. Depending on the doping and geometry, the avalanche voltage $V_A$ can range from 2 to 30 volts, and the low voltage $V_L$ is approximately 1 volt.

The ON state of the ESD diode 210 is maintained until the current is forced to zero by external means, such as when the anode voltage drops below the cathode voltage plus a certain amount, e.g., plus the low voltage state $V_L$ of approximately 1 volt. Internal feedback maintains the ESD diode 210 in this ON state, which is usually characterized by a uniform distribution of current across the area of the ESD diode 210.

Figure 5:
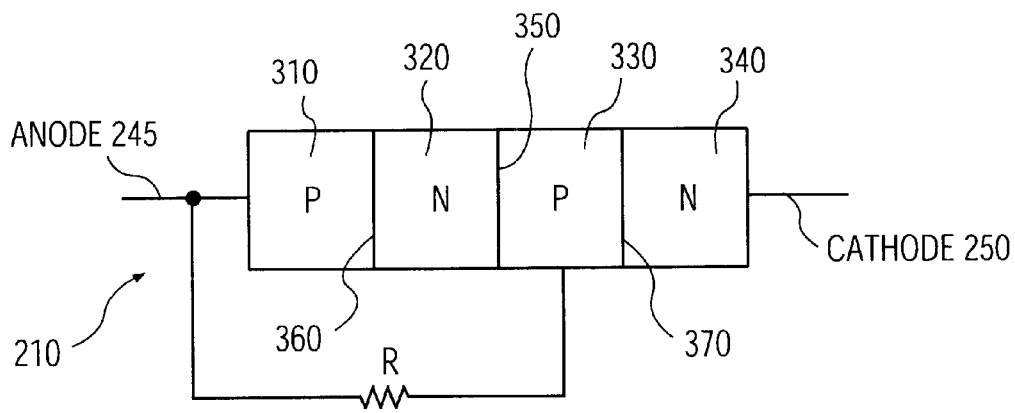
FIG. 5 shows an embodiment of the ESD diode with a resistor according to present invention.

The PNPN switch or ESD diode 210 can also be triggered into the high current and low voltage ON state by forward biasing either the P-N junction 360 near the anode 245 or the P-N junction 370 near the cathode 250. FIG. 5 shows an embodiment of the ESD diode 210 where a resistor R is connected between the two P regions 310, 330, for triggering ON the ESD diode 210. The The resistor R makes the ESD diode 210 act in a manner similar to a conventional diode D1 or P-N junction. Referring to FIGS. 4–5, when the voltage on the anode 245 is increased to be higher by the TURN-ON voltage $V_T$, for example, with respect to the cathode 250, current will go through the resistor R and through the P-N junction 370 near the cathode 250. This triggers the ESD diode 210 into the ON state so that the majority of the current goes through the ESD diode 210 instead of into the circuit 110 (FIG. 2). The voltage drop $V_L$ across the ESD diode 210 in the ON state is approximately 1 volt, which is slightly higher than the 0.7 volt drop $V_T$ of a conventional diode D1 (FIG. 1). The voltage drops $V_T$ and $V_L$ across the conventional diode D1 and the ESD diode 210, respectively, are shown in FIG. 4.

The disadvantage of the higher ESD diode voltage drop $V_L$ as compared to the voltage drop $V_T$ of the conventional diode D1 is not significant, and the ESD diode 210 is well suited to carry the ESD current. This disadvantage is more than offset by the advantage during normal (non-ESD) operation, namely, of having a reduced capacitance. The ESD diode 210 has two reverse biased junctions 360, 370 and one forward biased junction 350 connected in series which are equivalent to three capacitances connected in series. The series connection of the junction capacitances results in lower total capacitance. The lower capacitance permits use of the ESD diode 210 at higher frequencies than that for a conventional diode configuration D1. Illustratively, the ESD diode 210 operates properly up to 30 GHz and higher.

It is customary in most processes to form the ESD protection devices without requiring additional process steps. The process is optimized for the conventional transistors and passive components, and the ESD devices are often not optimized because they make are formed with the basic process flow. For example, a frequently used protection device in CMOS is a lateral NPN bipolar transistor that is a parasitic element that occurs when an N-channel MOSFET is formed. When a PNPN device is formed in a process that is optimized to make NPN bipolar transistors and/or CMOS transistors, there are usually several ways of forming the PNPN device, for example, using different combinations of wells and diffusions. Some of the possible PNPN devices formed in a given process may be better for use as ESD protection than others. In other situations, adding components like the resistor R may be necessary to make the ESD protection function as desired.

Figure 6:
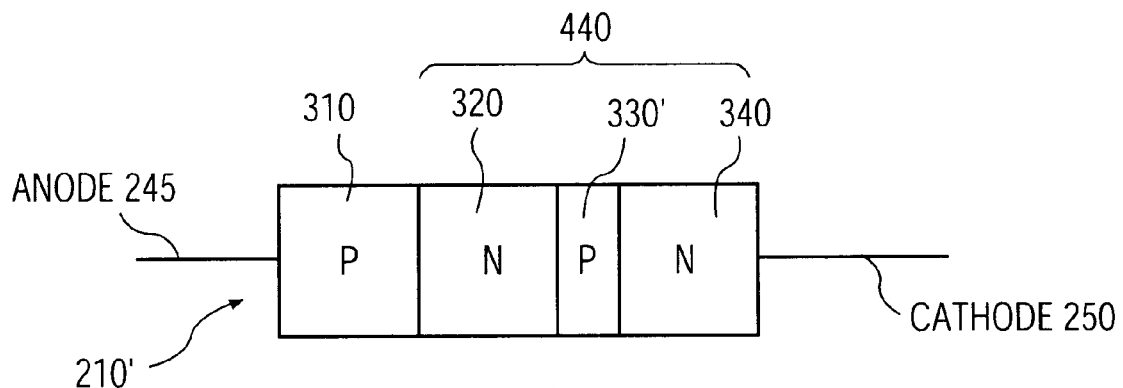
FIG. 6 shows another embodiment of the ESD diode having a high gain region according to present invention.

In some cases, the resistor R shown in FIG. 5 may be deleted. FIG. 6 shows an embodiment of the ESD diode 210' where the resistor R shown in FIG. 5 is not used. Instead, the process allows a configuration of the geometry and doping concentration of regions 340, 330' and 320 that results in a high gain NPN transistor 440. In this embodiment, the ESD diode 210' is formed by first forming the high gain NPN transistor 440 like a conventional transistor in the process. Next, an additional P-type layer 310 is formed over the high gain NPN transistor to form the ESD diode 210'.

The ESD diode may be formed using a bipolar or a complementary metal oxide semiconductor (CMOS) process or a combination of a bipolar-CMOS (bi-CMOS) process as is well known in the art. Typically, the resistor R shown in FIG. 5 is not needed for proper operation of the ESD diode when it is formed by a high performance bipolar process where a high gain NPN transistor is formed. Of course, the resistor R may be added if desired.

The conventional integrated junction diodes D1–D4, shown in FIG. 1, are replaced with the two terminal integrated structure 210, 210' shown in FIGS. 3 and 5–6. The two terminal integrated structure or ESD diode performs a function similar to a conventional diode D1 but is better suited to carry high currents and has less capacitance than a conventional diode D1 with similar current carrying capabilities. The four regions 310, 320, 330, 340 may be formed over each other, where three junctions capacitors are connected in series thus resulting in a reduced capacitance using the same area. This allows the ESD diode to shunt large ESD currents and operate at high frequencies.

Conventional PNPN devices that have been used for ESD protection are typically silicon controlled rectifier (SCR) type devices and have more than two terminals, instead of only the two terminals of the ESD diode 310, namely the cathode and the anode. In addition, the conventional PNPN devices are connected in an-opposite direction than the ESD diode. For example, if the conventional PNPN devices are connected to provide positive ESD protection, thus replacing the ESD diodes 210, 215 (FIG. 2), then the P-region of the conventional PNPN devices is connected to the power line 140, while the N-region is connected to the input or output terminals 115, 120. Similarly, if the conventional PNPN devices are connected to provide negative ESD protection, thus replacing the ESD diodes 220, 225, then the N-region of the conventional PNPN devices is connected to the ground line 135, while the P-region is connected to the input or output terminals 115, 120.

Further, the conventional PNPN devices typically block current, both in the forward and reverse directions, and need to be triggered ON by an additional signal or voltage applied to an additional terminal before ESD current is shunted. Typically, efforts have been made to reduce the trigger voltage of conventional PNPN devices. By contrast, the ESD diode is not blocking in the forward direction, either due to the geometry and doping or due to the use of resistor R.

Figure 7:
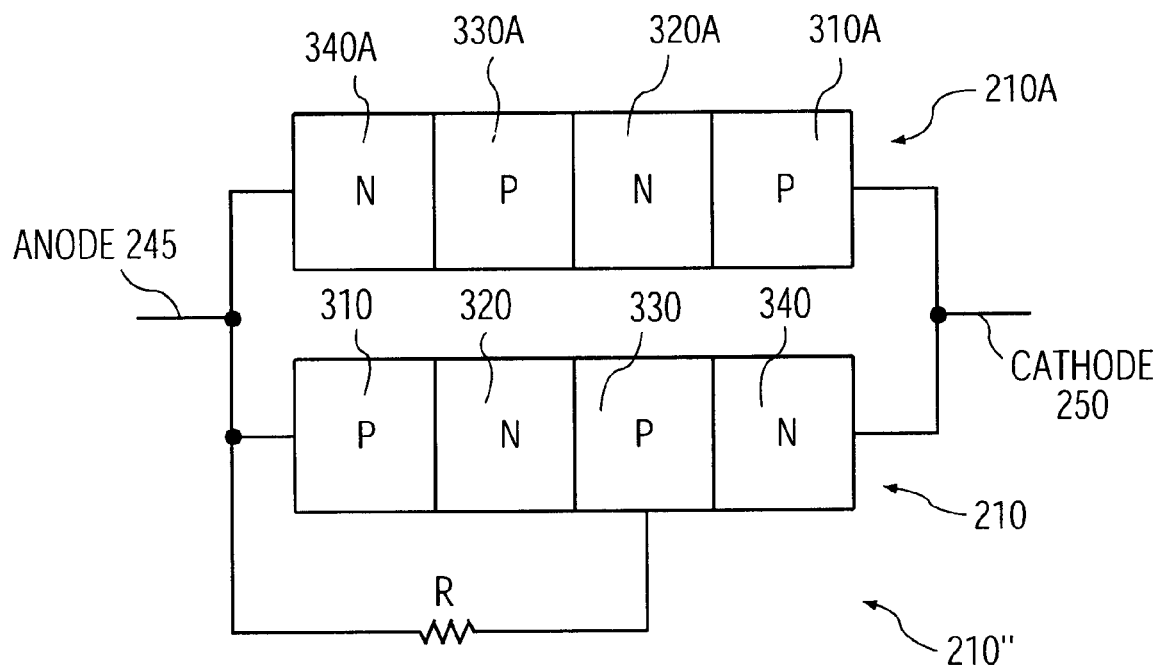
FIG. 7 shows a bi-directional ESD diode having two ESD diodes connected in an anti parallel configuration according to present invention.

FIG. 7 shows-another embodiment referred to as a bi-directional ESD diode 210" where two ESD diodes 210 (FIG. 3) are connected in an anti parallel configuration. The second ESD diode 210A is used to protect the first one from overvoltage in the reverse direction which may destroy the first ESD diode. The four ESD diodes, 210, 215, 220, 225 used in the circuit arrangement 200 of FIG. 2 are substituted with four bi-directional ESD diode 210", which are connected in a similar fashion as the four the ESD diodes 210, 215, 220, 225. As shown in FIG. 7, the anti parallel connection of two ESD diodes includes one ESD diode 210 having the first region 310, being P-type, connected to the anode 245, and the fourth region 340 of the N-type connected to the cathode 250. Similar to FIG. 3, after the first region 310, the ESD diode 210 has second and third regions 320, 330 of the N and P type, respectively.

The second ESD diode 210A of the bi-directional ESD diode 210" has its first region 310A of the P-type connected to the cathode 250, instead of the anode 245. The second region 320A of the N-type is located next to the first region 310A, and the third region 330A of the P-type is located next to the second region 320A. The fourth region 340A of the second ESD diode 210A is located next the third region 330A and is connected to the anode 245.

As described in connection with FIGS. 5–6, a resistor R may be connected between the anode 245 and the third region 330 of the P-type of the first ESD diode 210. Alternatively, or in addition to the resistor R, the third region 330 may have the geometry and the appropriate doping to produce a high performance NPN transistor similar to that described in connection with FIG. 6.

Figure 8:
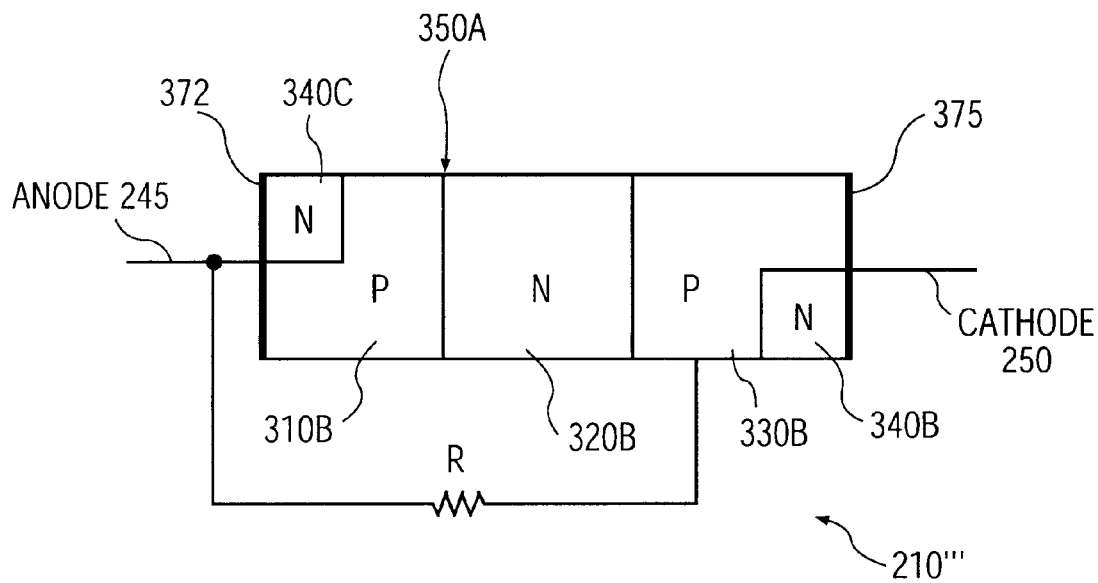
FIG. 8 shows another embodiment of the bi-directional ESD diode having a merged configuration according to present invention.

Instead of being configured as two physical PNPN devices as indicated in FIG. 7, the two ESD diodes 210, 210A may be merged together to form the bi-directional ESD diode 210'" shown in FIG. 8. The bi-directional ESD diode 210'" is an NPNPN device with the resistor R connected between the anode 245 and the third region 330B of the P-type.

The bi-directional ESD diode 210'" comprises two PNPN devices connected in a merged anti parallel configuration such that one of them is driven into the ON state, i.e., the low voltage/high current mode, through the resistor R, for example, when the voltage from the anode 245 to the cathode 250 is positive. As shown in FIG. 8, this PNPN device includes the first region (P-type) 310B, the second region (N-type) 320B, the third region (P-type) 330B, and the fourth (N-type) 340B.

The second PNPN device includes the third region (P-type) 330B, the second region (N-type) 320B, the first region (P-type) 310B, and the fifth (N-type) 340C. The second PNPN device is driven into the ON state of low voltage/high current mode by avalanching the center junction of this second PNPN device. This center junction is shown in FIG. 8 as reference 350A where avalanche occurs when the voltage of the cathode 250 is greater than the voltage of the anode 245, e.g., when the voltage-from the cathode 250 to the anode 245 is positive.

Similar to the ESD diode 210 (FIG. 3), the bi-directional ESD diode 210", 210'" (FIGS. 7–8) may be formed using a bipolar, a CMOS process, or a combination of a bipolar-CMOS (bi-CMOS) process as is well known in the art. It is noteworthy that the P and N regions 310B, 340C at the anode 245 are connected together by a conductor 372 such as a metal. Similarly, the P and N regions 330B, 340B at the cathode 250 are connected together a conductor 375 such as a metal. This provides only one PNPN structure in either direction, instead of an NPNPN structure. The anode 245 and cathode 250 of the bi-directional ESD diode 210'" perform the same functions and are connected to protect the circuit 110 shown in FIG. 2 in a manner similar to the anode and cathode in the ESD diodes 210, 215, 220, 225. For example, because of the resistor R from the anode 245 to the internal P-region 330B, the bi-directional ESD diode 210'" functions in a manner similar to a forward biased diode D1 when the anode 245 has a greater voltage with respect to the cathode 205.

For the opposite polarity where the anode 245 has a smaller voltage with respect to the cathode 205, the second PNPN structure is triggered like a PNPN diode by avalanching the center junction 350A and driving it into the ON state or the low voltage/high current mode.

Four bi-directional ESD diode 210" may replace the conventional integrated junction diodes D1–D4 shown in FIG. 1. The bi-directional ESD diodes 210" perform a function similar to the conventional diodes D1–D4 but are better suited to carry high currents and have less capacitance than a conventional diode with similar current carrying capabilities. The bi-directional ESD diode 210" triggers into a low voltage/high current mode when a certain voltage, referred to as the reverse avalanche voltage $V_{AR}$ (FIG. 9), is exceeded in the reverse direction.

Figure 9:
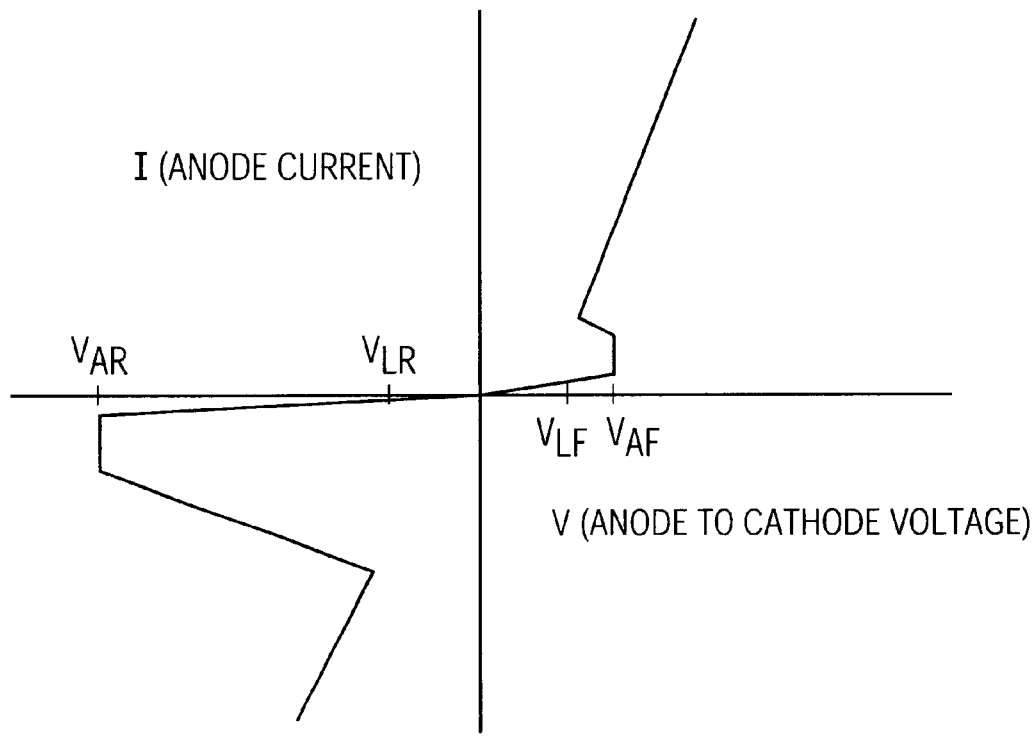
FIG. 9 shows a current-voltage characteristics of the bi-directional ESD diode according to present invention.

FIG. 9 shows the current to voltage characteristic of the bi-directional ESD diode 210", 210'" shown in FIG. 7–8. In FIG. 9, the avalanche and snap-back voltage of the forward diode is shown as $V_{AF}$ and $V_{LF}$, and the avalanche and snap-back voltage of the reverse diode is shown as $V_{AR}$ and $V_{LR}$. The current/voltage characteristic of the first or forward ESD diode shown in FIG. 9 is similar to the current/voltage characteristic 420 shown in FIG. 4. Similar to FIG. 4, the forward avalanche voltage $V_{AF}$ is approximately 2 volts and the forward low voltage $V_{LF}$ is approximately 1 volt, for example. The reverse avalanche voltage $V_{AR}$ is approximately 15 volts and the reverse low voltage $V_{LR}$ is approximately 1 volt, for example.

In summary, the first or forward ESD diode is referenced by numeral 210 in the anti-parallel configuration of the bi-directional ESD diode 210" FIG. 7. Further, in the merged bi-directional ESD diode 210'" shown in FIG. 8, the first or forward ESD diode has the following regions: the first region (P-type) 310B, the second region (N-type) 320B, the third region (P-type) 330B, and the fourth (N-type) 340B. The second or reverse ESD diode is referenced by numeral 210A in the anti-parallel configuration of the bi-directional ESD diode 210" FIG. 7. Further, in the merged bi-directional ESD diode 210'" shown in FIG. 8, the second or reverse ESD diode has the following regions: the third region (P-type) 330B, the second region (N-type) 320B, the first region (P-type) 310B, and the fifth (N-type) 340C.

With reference to FIGS. 2 and 9, the ESD diode 210, 215, 220, 225 are replaced with the bi-directional ESD diodes. Positive ESD on the input and output lines 120 is shunted to the ground line 135 by the bi-directional ESD diodes in a manner similar to the ESD diodes 210, 215 replaced by the bi-directional ESD diodes. In particular, positive ESD is shunted to the ground line 135 through the power line 140 and power supply clamp 155. In addition, a path is provided directly to ground 135 through the bi-directional ESD diodes that replace the ESD diodes 220, 225.

Further, negative ESD on the input and output lines 120 is shunted to the ground line 135 by the bi-directional ESD diodes in a manner similar to the ESD diodes 220, 225 which are replaced by the bi-directional ESD diodes. In particular, negative ESD is shunted directly to the ground line 135. In addition, the negative ESD is also shunted to the ground line 135 through the bi-directional ESD diode that replace the ESD diodes 210, 215.

Similar to the embodiment of the ESD diode 210' shown in FIG. 6, the resistor R shown in FIGS. 7–8 may be deleted. Instead, the geometry and doping concentration of regions 340, 330' and 320 are configured to make a high gain NPN transistor.

The bi-directional ESD diode 210", 210'" (FIGS. 7–8) has the same advantages as the ESD diode 210 (FIG. 3), in that the device is designed to carry high currents and the capacitance is lower than that of a single P-N junction diode D1 (FIG. 1). The added advantage of the bi-directional ESD diode over the ESD diode is that the bi-directional ESD diode provides ESD protection in the reverse direction that is much better than a conventional diode D1 as well as the ESD Diode. The trade-off is that additional area is needed to have two PNPN devices, such as the two diodes 210, 210A shown in FIG. 7. The required additional area is reduced using the merged bi-directional ESD diode 210'" shown in FIG. 8. Because of this additional area, the capacitance of the bidirectional ESD diode is larger than the capacitance of the ESD diode 210 (FIG. 3). Thus, the ESD diode 210 is preferable for higher frequency applications.

While the present invention has been described in particular detail, it should also be appreciated that numerous modifications are possible within the intended spirit and scope of the invention. In interpreting the appended claims it should be understood that:

a) the word "comprising" does not exclude the presence of other elements or acts than those listed in a claim;

b) the word "a" or "an" preceding an element does not exclude the presence of a plurality of such elements.

c) any reference signs in the claims do not limit their scope; and d) several "means" may be represented by the same item of hardware or software implemented structure or function.

What is claimed is:

1. A bi-directional device for protecting a circuit against electrostatic discharge having four adjacent regions, said device comprising:

a first region and a third region formed from a semiconductor substrate having a p-type conductivity;

a second region and a fourth region formed from said semiconductor substrate having an n-type conductivity; and a resistor connected between said third region and an anode terminal;

wherein said first region is for connection to said anode terminal of said bi-directional device, and wherein said fourth region is for connection a cathode terminal of said bi-directional device, said anode terminal being for connection to a signal terminal of said circuit when said cathode terminal is connected to a positive power line of said circuit, and said cathode terminal is for connection to said signal terminal when said anode terminal is connected to one of a ground line and a negative power line of said circuit; and wherein said first region includes a first portion having an n-type conductivity for additional connection to said anode terminal and said third region includes an extended portion which extends into said fourth region for another connection to said cathode terminal.

2. The bi-directional device of claim 1, further comprising a first conductive layer formed over said first region and said first portion, and a second conductive layer formed over said fourth region and said second portion.

3. The bidirectional device of claim 2, wherein said first conductive layer is connected to said anode terminal and said second conductive layer is connected to said cathode terminal.

4. A bi-directional diode for protecting a circuit against electrostatic discharge having a first device and a second device, each of said first device and said second device comprising:

a first region and a third region formed from a semiconductor substrate having a p-type conductivity;

a second region and a fourth region formed from said semiconductor substrate having an n-type conductivity; and a resistor connected between said first region of said first device and a third region of said first device located between said fourth region of said first device and a second region of said first device;

wherein a first region of said first device and a fourth region of said second device are for connection to an anode terminal of said bi-directional diode, and wherein a fourth region of said first device and a first region of said second device are for connection a cathode terminal of said bi-directional diode;

said anode terminal being for connection to a signal terminal of said circuit when said cathode terminal is connected to a positive power line of said circuit, and said cathode terminal being for connection to said signal terminal when said anode terminal is connected to one of a ground line and a negative power line of said circuit.

5. A protected circuit arrangement comprising:

a circuit having a signal terminal, said circuit being connected to a first power line for providing a positive voltage and a second power line for providing one of a negative voltage and ground; and a plurality of bi-directional diodes for protecting said circuit against electrostatic discharge, each of said plurality of bi-directional diodes having a first device and a second device, each of said first device and said second device comprising:
  a first region and a third region formed from a semiconductor substrate having a p-type conductivity;
  a second region and a fourth region formed from said semiconductor substrate having an n-type conductivity; and
  a resistor connected between said third region and an anode terminal;
  wherein a first region of said first device and a fourth region of said second device are for connection to said anode terminal of said bi-directional diode, and wherein a fourth region of said first device and a first region of said second device are for connection a cathode terminal of said bi-directional diode;
  said anode terminal being for connection to said signal terminal of said circuit when said cathode terminal is connected to said first power line, and said cathode terminal being for connection to said signal terminal when said anode terminal is connected to said second power line.

6. The protected circuit arrangement of claim 5, wherein said signal terminal is one of an input terminal and an output terminal of said circuit.

7. The protected circuit arrangement of claim 5, further comprising an input pad connected to said signal terminal.

8. The protected circuit arrangement of claim 5, further comprising a power supply clamp connected between said first power line and said second power line.

9. A protected circuit arrangement comprising:

a circuit having a signal terminal, said circuit being connected to a first power line for providing a positive voltage and a second power line for providing one of a negative voltage and ground; and a plurality of bi-directional diodes for protecting said circuit against electrostatic discharge, each of said plurality of bi-directional diodes comprising:
  a first region and a third region formed from a semiconductor substrate having a p-type conductivity;
  a second region and a fourth region formed from said semiconductor substrate having an n-type conductivity;
  a second region and a fourth region formed from said semiconductor substrate having an n-type conductivity; and
  a resistor connected between said third region and an anode terminal;
  wherein said first region is for connection to said anode terminal of said bi-directional device, and wherein said fourth region is for connection a cathode terminal of said bidirectional device,
  said anode terminal being for connection to a signal terminal of said circuit when said cathode terminal is connected to a positive power line of said circuit, and said cathode terminal is for connection to said signal terminal when said anode terminal is connected to one of a ground line and a negative power line of said circuit; and
  wherein said first region includes a first portion having an n-type conductivity for additional connection to said anode terminal and said third region includes an extended portion which extends into said fourth region for another connection to said cathode terminal.

* * * * *